US007999464B2

(12) United States Patent  
Komatsu et al.

(10) Patent No.: US 7,999,464 B2  
(45) Date of Patent: Aug. 16, 2011

(54) DISPLAY DEVICE AND COMPOSITE DISPLAY DEVICE

(75) Inventors: Takashi Komatsu, Sammu (JP); Kyuzo Nakamura, Chigasaki (JP); Hiroaki Katagiri, Sammu (JP); Noriaki Tani, Sammu (JP); Kazuya Saito, Chigasaki (JP)

(73) Assignee: Ulvac, Inc., Chigasaki-shi (JP)

( * ) Notice: Subject to any disclaimer, the term of this patent is extended or adjusted under 35 U.S.C. 154(b) by 147 days.

(21) Appl. No.: 12/245,113

(22) Filed: Oct. 3, 2008

(65) Prior Publication Data

US 2009/0058265 A1    Mar. 5, 2009

Related U.S. Application Data

(63) Continuation of application No. PCT/JP2007/058449, filed on Apr. 18, 2007.

(30) Foreign Application Priority Data

Apr. 27, 2006    (JP) .................................. 2006-124141

(51) Int. Cl.  
*H05B 33/02* (2006.01)

(52) U.S. Cl. ........................................ 313/506; 313/498

(58) Field of Classification Search .................... 257/40, 257/72, 98–100, 642–643, 759; 313/498–512; 315/169.1, 169.3; 427/58, 64, 66, 532–535, 427/539; 428/690–691, 917; 438/26–29, 438/34, 82; 445/24–25

See application file for complete search history.

(56) References Cited

U.S. PATENT DOCUMENTS

| 6,614,173 | B2 | 9/2003 | Yano et al. .................... 313/503 |
| 6,761,835 | B2 | 7/2004 | Yano et al. ................. 252/301.4 |
| 2004/0185604 | A1* | 9/2004 | Park et al. ..................... 438/149 |
| 2004/0263039 | A1 | 12/2004 | Takei et al. .................... 313/110 |
| 2006/0011914 | A1 | 1/2006 | Kim et al. ........................ 257/59 |
| 2006/0022587 | A1 | 2/2006 | Jeong et al. ................... 313/504 |
| 2006/0027806 | A1* | 2/2006 | Koo et al. ........................ 257/59 |
| 2006/0027838 | A1 | 2/2006 | Koo et al. ...................... 257/257 |
| 2006/0108919 | A1* | 5/2006 | Kobayashi .................... 313/506 |

(Continued)

FOREIGN PATENT DOCUMENTS

JP    59-163787    9/1984

(Continued)

OTHER PUBLICATIONS

Office Action dated Nov. 12, 2003 corresponding to Korean Patent Application No. 10-0405182 B1.

(Continued)

*Primary Examiner* — Nimeshkumar D Patel  
*Assistant Examiner* — Donald L Raleigh  
(74) *Attorney, Agent, or Firm* — Kratz, Quintos & Hanson, LLP

(57) ABSTRACT

A display device which can be driven by a thin-film transistor and has a high brightness is provided. A low-voltage-driven inorganic luminescent layer and a control transistor are formed on a substrate. The voltage which is applied to the inorganic luminescent layer is controlled by the control transistor. The inorganic luminescent layer has such strength against heat and any damage such that the inorganic luminescent layer can be formed by sputtering method. A top-emission type display device and a bottom-emission type display device can be formed on the same substrate and the luminescent light can be emitted from the same position.

5 Claims, 4 Drawing Sheets

U.S. PATENT DOCUMENTS

2006/0170336 A1  8/2006  Ono et al. .................. 313/504
2007/0200496 A1*  8/2007  Cok et al. .................. 313/512

FOREIGN PATENT DOCUMENTS

| | | |
|---|---|---|
| JP | 2002-180038 | 6/2002 |
| JP | 2005-5223 A1 | 1/2005 |
| JP | 2005005223 A * | 1/2005 |
| JP | 2005-336275 A1 | 12/2005 |
| JP | 2006-195638 | 7/2006 |
| JP | 2007-115645 A1 | 5/2007 |
| WO | WO2005/004547 A1 | 1/2005 |
| WO | WO 2005/051048 A1 | 6/2005 |

OTHER PUBLICATIONS

Office Action dated Apr. 22, 2010—Decision on grant corresponding to Russian patent application No. 2008146742(061095) with English translation.

International Search Report for International Application No. PCT/JP2007/058449 dated May 24, 2007.

European Search Report dated Oct. 7, 2010.

Japanese Office Action dated Dec. 7, 2010.

* cited by examiner

302

DISPLAY DEVICE AND COMPOSITE DISPLAY DEVICE

This is a Continuation of International Application No. PCT/JP2007/058449 filed Apr. 18, 2007, which claims priority to Japan Patent Application No. 2006-124141, filed on Apr. 27, 2006. The entire disclosures of the prior applications are hereby incorporated by reference herein in their entireties.

BACKGROUND

The present invention generally relates to a technical field of a flat display device, and more particularly to a display device using an inorganic luminescent layer.

Presently, a display device or a light emitting device is being developed using an organic EL element.

However, there is a problem when an organic material is used as the organic EL element in that the material deteriorates due to moisture or the like, and has a short life time. In addition, due to its weakness against damage, an organic layer of the organic EL element cannot be deposited by sputtering; and it is also difficult to use a sputtering method for a film to be formed on the organic layer.

Further, when a color display panel is produced, it is necessary to form organic films of different materials corresponding to three colors; and it is difficult to increase the size of the area and there is a problem in that the display device becomes expensive.

An inorganic material used for an inorganic EL element is superior to that of the organic EL in terms of a longer life. Further, the inorganic EL can select many kinds of deposition methods (such as, sputtering or the like) because of its strength against damage and can easily deal with a large-size substrate.

However, a conventional inorganic EL needs to be applied with a voltage of about 100 V for light emission and cannot be controlled with a drive circuit (such as, a thin-film transistor or the like).

Although there is a document disclosing that a display has been produced with the use of an inorganic EL element driven by a thin film transistor, a high voltage is required and a mass production technology for this display has not yet been accomplished; and thus, the inorganic EL has not been used for a high resolution display or the like.

Recently, an inorganic EL material has been developed, which is capable of light emission at a lower voltage than in the conventional technique (Patent document 1). Specifically, it is known that an inorganic EL material containing ZnS emits light with a high brightness at a voltage of several volts (lower than ten volts), and the material is expected to have the possibility of a light emission control by the thin-film transistor due to the low voltage; and a color display device using a white inorganic EL and a color filter is expected to be mass-produced because of the high brightness. See, patent document No. JP A 2005-336275.

SUMMARY OF THE INVENTION

The present invention provides a display device and a display capable of TFT drive using an inorganic EL element which emits light at a low voltage.

For solving the above-discussed problems, a display device of the present invention has a substrate and a pixel electrode disposed on the substrate, an inorganic luminescent layer disposed on the pixel electrode, an opposite electrode disposed on the inorganic luminescent layer, and a thin-film transistor which applies a voltage across the pixel electrode and the opposite electrode and causes the inorganic luminescent layer to emit light in a conduction state thereof.

Further, in the display device of the present invention, the substrate and the pixel electrode are transparent and the luminescent light emitted from the inorganic luminescent layer is transmitted through the pixel electrode and the substrate to be emitted outside.

Still further, the display device of the present invention includes a color filter disposed at a position where the luminescent light transmitted through the substrate is irradiated.

Yet still further, in the display device of the present invention, the opposite electrode is transparent and the luminescent light emitted from the inorganic luminescent layer is transmitted through the opposite electrode to be emitted outside.

Yet still further, the display device of the present invention includes a color filter disposed at a position where the luminescent light transmitted through the opposite electrode is irradiated.

Yet still further, in the display device of the present invention, the inorganic luminescent layer contains, for example, zinc sulfide.

A composite display device of the present invention includes a first pixel electrode, a first inorganic luminescent layer, a first opposite electrode, and a first thin-film transistor disposed over one surface of a substrate, and a second pixel electrode, a second inorganic luminescent layer, a second opposite electrode, and a second thin-film transistor disposed over the other surface of the substrate, the substrate, the first and second pixel electrodes, the second opposite electrode being transparent. When the first and second thin-film transistors are in a conduction state, a voltage is applied across the first pixel electrode and the first opposite electrode and across the second pixel electrode and the second opposite electrode; and the first and second inorganic luminescent layers emit light respectively; the second inorganic luminescent layer is located at the same position as the first inorganic luminescent layer right behind the side thereof, a luminescent light of the first inorganic luminescent layer is transmitted through the first pixel electrode, the substrate, and the second pixel electrode, in this order, to be irradiated on the second inorganic luminescent layer, and further transmitted through the second inorganic luminescent layer and the second opposite electrode to be emitted outside; and luminescent light of the second inorganic luminescent layer is transmitted through the second opposite layer to be emitted outside.

Further, the composite display device of the present invention includes a color filter disposed at a position where the luminescent light transmitted through the second opposite electrode is irradiated.

Still further, in the composite display device of the present invention, the first and second inorganic luminescent layers contain, for example, zinc sulfide.

Inorganic luminescent material is expected to be damage-resistant and to have along life time compared to organic luminescent material.

The inorganic luminescent layer can be formed by sputtering method.

The opposite electrode formed on the inorganic luminescent layer can be formed by sputtering method.

The inorganic luminescent layer can be driven at a low voltage and the light emission thereof can be controlled by the thin-film transistor.

Further, since the inorganic luminescent layer is heat-resistant, a bottom-emission type display device and a top-emission type display device can be disposed on the same substrate and emitted light thereof can be overlapped.

Using a film containing zinc sulfide for the inorganic luminescent layer, it is possible to obtain a high brightness; and a low voltage of 10 V or less is sufficient for the light emission.

DETAILED DESCRIPTION OF THE EMBODIMENTS

An embodiment will be described in reference to a TFT type active matrix for the display devices of liquid crystal or an organic EL.

Figure 1:
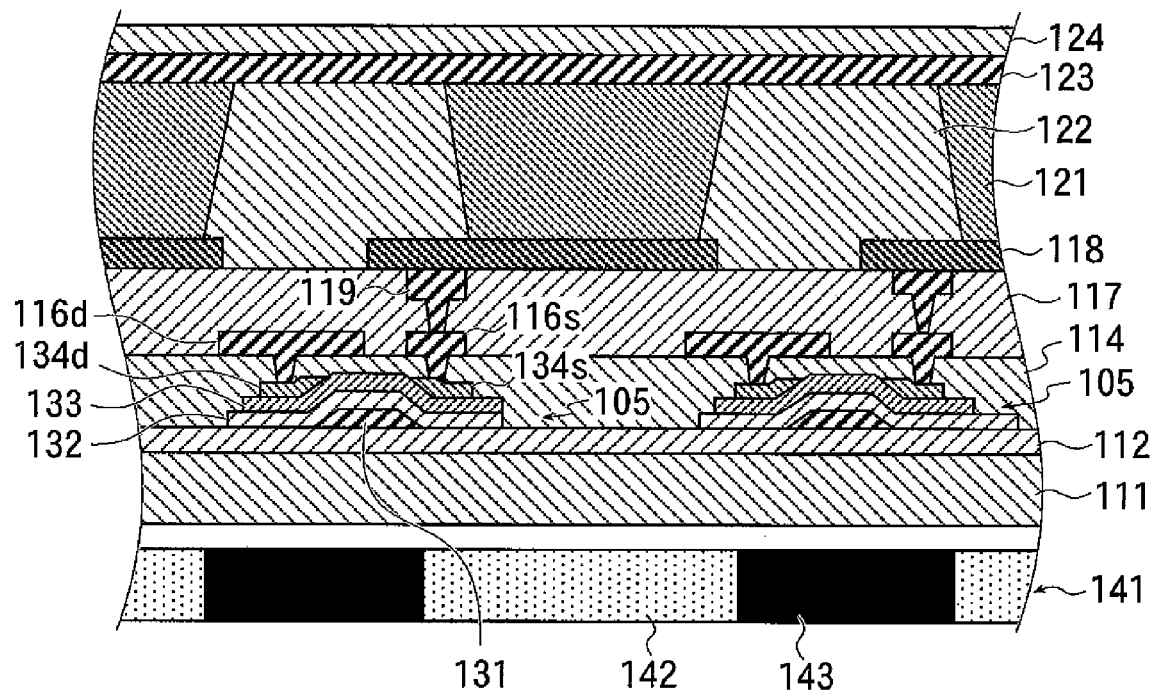
FIG. 1 is a diagram for illustrating a bottom-emission type display device among display devices of the present invention.
Figure 2:
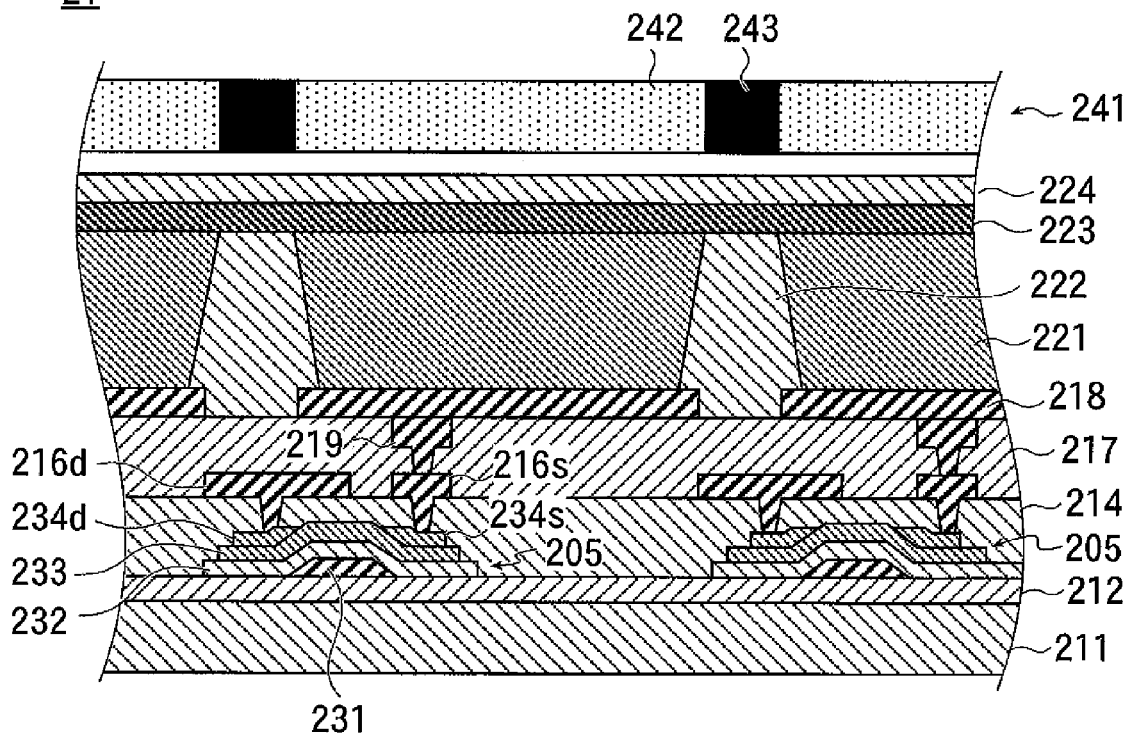
FIG. 2 is a diagram for illustrating a top-emission type display device among display devices of the present invention.

Reference numerals 11 and 21 in FIG. 1 and FIG. 2 indicate examples of display devices of the present invention. The display device in FIG. 1 is a bottom-emission type; and the display device 21 in FIG. 2 is a top-emission type. A TFT can be formed of single-crystal silicon, amorphous silicon, or poly silicon.

These display devices 11 and 21 include substrates 111 and 211, respectively; insulating films 112 and 212 are formed on the substrates 111 and 211, respectively; and one or more thin-film transistors (TFT) are arranged on each of the insulating films 112 and 212.

Among the thin-film transistors, a control transistor is indicated by Symbols 105 or 205 in FIG. 1 or 2.

A first insulating film 114, 214 is disposed on the control transistor 105, 205; and a patterned source electrode 116$s$, 216$s$ and a patterned drain electrode 116$d$, 216$d$ are disposed on the surface of the first insulating film 114, 214.

The control transistor 105, 205 includes a gate electrode 131, 231, a gate insulating film 132, 232, and a semiconductor layer 133, 233. The gate insulating film 132, 232 is sandwiched between the gate electrode 131, 231 and the semiconductor layer 133, 233.

A source region 134$s$, 234$s$ and a drain region 134$d$, 234$d$, which are a conduction-type opposite to the semiconductor layer 133, 233, are disposed on the semiconductor layer 133, 233 at both end positions thereof, respectively.

The source electrode 116$s$, 216$s$ and the drain electrode 116$d$, 216$d$ are connected to source region 134$s$, 234$s$ and the drain region 134$d$, 234$d$, respectively.

The control transistor 105, 205 is configured as follows: when a voltage is applied to the gate electrode 131, 231 as described later, an inversion layer is formed in the semiconductor layer 133, 233; the source region 134$s$, 234$s$ and the drain region 134$d$, 234$d$ are connected via the inversion layer; and then, the control transistor 105, 205 becomes conductive.

A second insulating film 117, 217 is disposed on the drain electrode 116$d$, 216$d$ and the source electrode 116$s$, 216$s$; and a plurality of patterned pixel electrodes 118, 218 are disposed on the second insulating film 117, 217.

Here, a conductive plug 119, 219 is embedded in the second insulating film 117, 217; and the source electrode 116$s$, 216$s$ and the pixel electrode 118, 218 are electrically connected to each other by the plug 119, 219.

An insulating separation wall 122, 222 is formed between the pixel electrodes 118, 218 for separating each of the pixel electrodes 118, 218, and an inorganic luminescent layer 121, 221 is disposed in a region separated by the separation wall 122, 222. The bottom surface of the inorganic luminescent layer 121, 221 is in contact with the pixel electrode 118, 218.

An opposite electrode 123, 223 is disposed on the surface of the inorganic luminescent layer 121, 221; and a protection film 124, 224 is further disposed on the surface of the opposite electrode 123, 223. The surface of the inorganic luminescent layer 121, 221 is in contact with the opposite electrode 123, 223.

In the bottom-emission type display device 11 in FIG. 1, a color filter 141 is disposed on the rear surface of the substrate 111; and in the top-emission type display device 21 in FIG. 2, a color filter 241 is disposed on the opposite electrode 223.

The color filter 141, 241 includes transmitting parts 142, 242 corresponding to R, G, and B (R, G, and B indicate red, green, and blue, respectively) and a light-blocking black matrix 143, 243 disposed between the transmitting parts 142, 242 and light transmitted through the neighboring transmitting parts 142, 242 is configured not to be mixed together and to have a single color among R, G, or B.

In the bottom-emission type display device 11, not only the substrate 111, but also materials located between inorganic luminescent layer 121 and the bottom substrate 111 such as the pixel electrode 118 and the first and second insulating films 114 and 117 or the like are transparent. When a voltage is applied across the inorganic luminescent layer 121 and the luminescent layer 121 emits light, the emitted light is transmitted through the materials (such as, the pixel electrode 118 or the like) and the substrate 111 under the bottom of the inorganic luminescent layer 121 to be emitted to the rear side of the substrate 111.

The luminescent light emitted to the rear side of the substrate 111 is transmitted through the transmitting part 142 of the color filter 141 and colored by any one of R, G, and B.

In the top-emission type display device 21 in FIG. 2, materials on the upper side of the inorganic luminescent layer 221, such as the opposite electrode 223 and the protective film 224, have transparency; and luminescent light emitted from the inorganic luminescent layer 221 is transmitted through the opposite electrode 223 or the like to be emitted to the outside. In the top-emission type display device 21, the luminescent light is not transmitted through the substrate 211.

As in the case of the bottom-omission type display device 11, the luminescent light transmitted through the opposite electrode 223 and emitted outside is transmitted through the transmitting part 242 of the color filter 241 to be colored by any one of R, G, and B.

Figure 4:
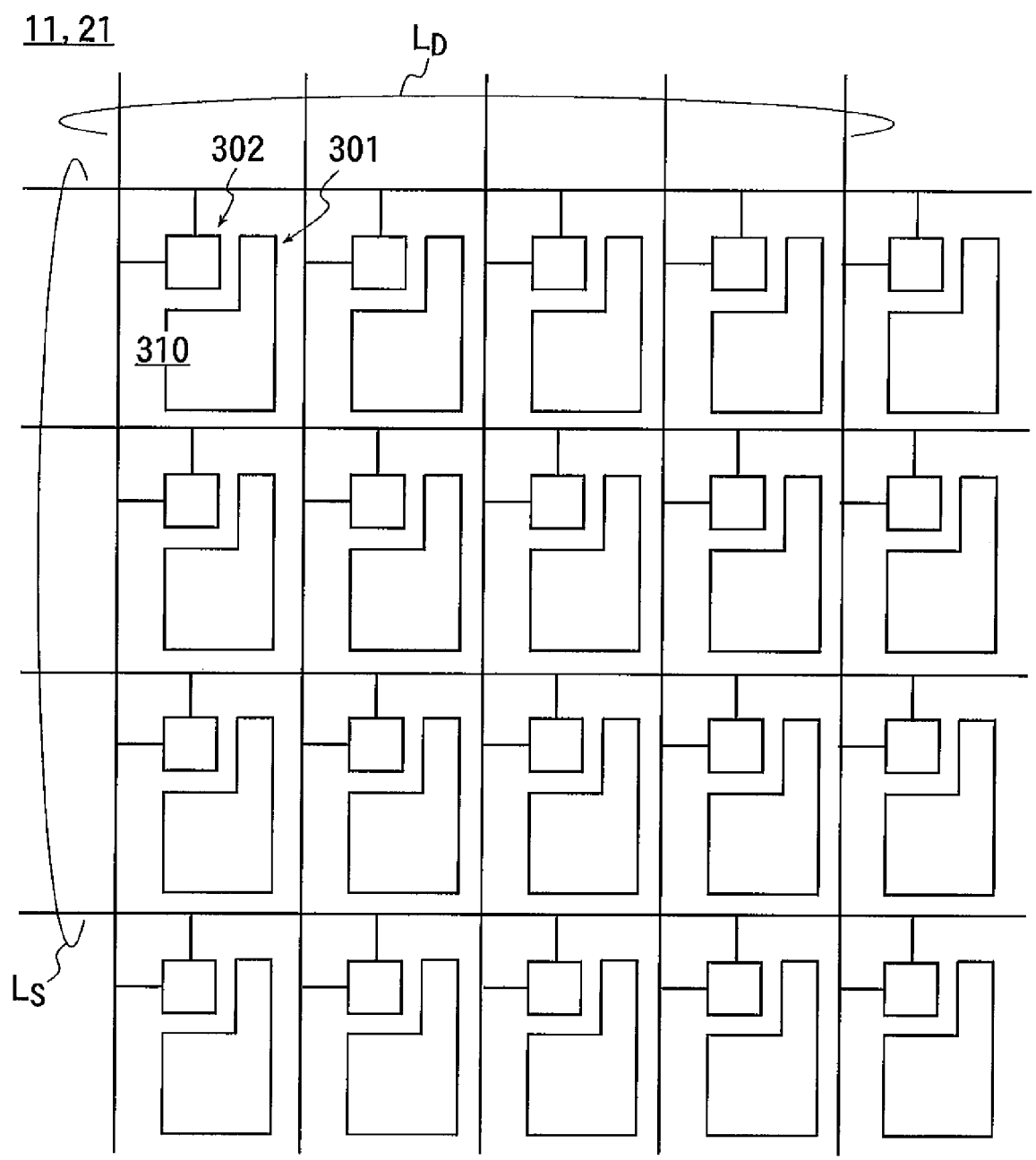
FIG. 4 is a plan view for illustrating an internal structure of a display device of the present invention.

FIG. 4 is a schematic plan view for illustrating the inside of the display device 11, 21 and therein are formed a scan line $L_S$ and a data line $L_D$ are formed with metal films (source voltage line $L_{dd}$ is omitted in the drawing). The scan lines $L_S$ and the data lines $L_D$ are arranged in a lattice on the substrate 111, 211.

Reference numeral 310 indicates a pixel region surrounded by the scan lines $L_S$ and the data lines $L_D$; and many of the pixel regions 310 are arranged in a matrix on the substrate 111, 211. Within each of the pixel regions 310, there are disposed a pixel part 301 where the inorganic luminescent layer 121, 221 are located and a circuit part 302 where a circuit is located for controlling light emission.

Figure 5:
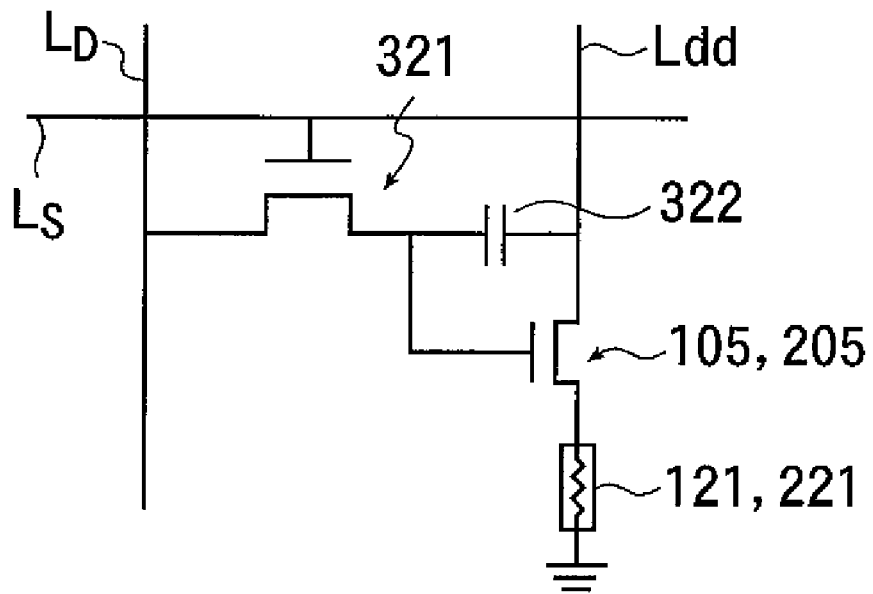
FIG. 5(A) is an example of a drive circuit for a display device of the present invention.
FIG. 5(B) is an example of a drive circuit for a liquid crystal display device.
Figure 5:
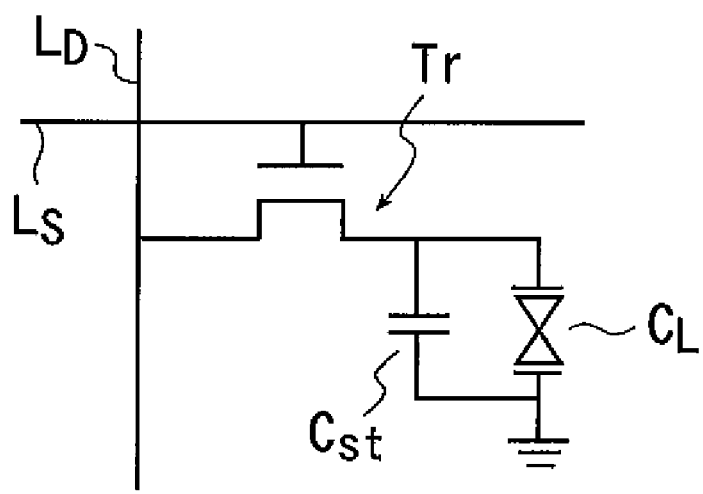

FIG. 5($a$) is a schematic diagram of the circuit that drives the display device 11, 21 of the present embodiment, and shown here is a DC-drive type circuit which applies a DC source voltage $V_{dd}$ across the inorganic luminescent layer 121, 221 for the light emission.

The circuit part 302 includes the above control transistor 105, 205, a storage capacitance 322, and a selection transistor 321.

The source electrode of the control transistor 105, 205 is connected to the pixel electrode 118, 218. The pixel electrode 118, 218 is in close contact with one side surface of the inorganic luminescent layer 121, 221 and the opposite electrode 123, 223 is in close contact with the other side surface of the inorganic luminescent layer 121, 221. The opposite electrode 123, 223 is connected to the earth potential.

The drain electrode of the control transistor 105, 205 is connected to the source voltage line $L_{dd}$, and the gate electrode is connected to the data line $L_D$ via the selection transistor 321. A gate terminal of the selection transistor 321 is connected to the scan line $L_S$, and the gate electrode of the control transistor 105, 205 is connected to the data line $L_D$ when the selection transistor 321 becomes conductive according to a polarity or a magnitude of a gate voltage applied to the scan line $L_S$. When the selection transistor 321 is switched off, the gate electrode of the control transistor 105, 205 is separated from the data line $L_D$.

When the gate electrode is connected to the data line $L_D$, the control transistor 105, 205 becomes conductive or switched off according to a polarity or a magnitude of a voltage of the data line $L_D$.

When the control transistor 105, 205 becomes conductive, the pixel electrode 118, 218 is connected to the source voltage line $L_{dd}$ and the inorganic luminescent layer 121, 221 is applied with the source voltage $V_{dd}$ to emit light.

The storage capacitance 322 is connected between the gate electrode and the drain electrode of the control transistor 105, 205, and the storage capacitance 322 is charged by the voltage of the data line $L_D$ connected to the gate electrode when the control transistor 105, 205 is in the conduction state.

When the selection transistor 321 is switched off in this state, the control transistor 105, 205 is kept conductive by the charged voltage of the storage capacitance 322.

After the voltage of the data line $L_D$ has been changed to the polarity and the magnitude to switch off the control transistor 105, 205, when the selection transistor 321 becomes conductive and the gate electrode of the control transistor 105, 205 is connected to the data line $L_D$, the control transistor 105, 205 is switched off and, at the same time, the charged voltage of the storage capacitance 322 is discharged and the light emission stops.

FIG. 5(b) shows a drive circuit for a liquid crystal display device in which a liquid crystal capacitance $C_L$, which is an equivalent circuit of the liquid crystal, is connected to the earth potential at one end and connected to a data line $L_D$ at the other end via a selection transistor Tr.

The liquid crystal capacitance $C_L$ is connected with a storage capacitance $C_{st}$ in parallel.

A gate electrode of the selection transistor Tr is connected to a scan line $L_S$. The liquid crystal capacitance $C_L$ and the storage capacitance $C_{st}$ are configured to be charged or discharged together when the selection transistor Tr becomes conductive.

While the storage capacitance 322 of the present embodiment is connected between the gate electrode and the drain electrode of the control transistor 105, 205 in the above example, the storage capacitance 322 may be connected between a terminal of the selection transistor 321 and the earth potential as in the case of the liquid crystal display device.

The inorganic luminescent layer 121, 221 used in the present embodiment is superior to a luminescent layer of organic compound (organic EL layer) in that the inorganic luminescent layer does not cause luminance deterioration or thermal decomposition even when heated at a high temperature. Accordingly, even when an additional inorganic luminescent layer is further formed after an inorganic luminescent layer has been formed, the inorganic luminescent layer formed previously is not deteriorated by the heat in forming the following inorganic luminescent layer, and it is possible to accumulate a plurality of layers of the inorganic luminescent layers and to form an additional luminescent layer on the other side of a substrate after an inorganic luminescent layer has been formed on the one side of the substrate.

Figure 3:
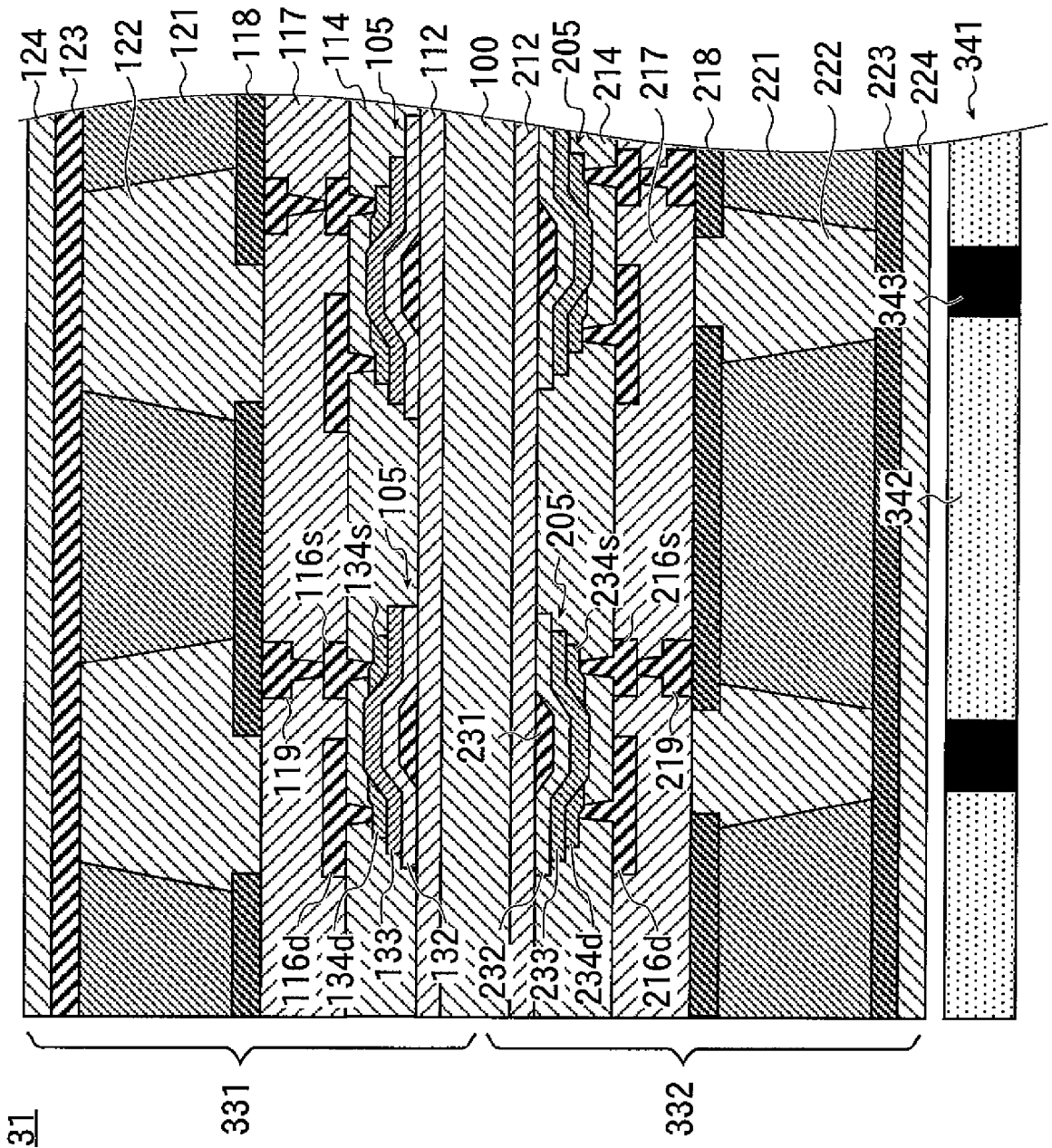
FIG. 3 is a diagram for illustrating a composite display device of the present invention.

Reference numeral 31 in FIG. 3 indicates a composite display device of the present embodiment. In this composite display device 31, the same members as in FIGS. 1 and 2 are denoted by the same reference numeral and description thereof is omitted. The composite display device 31 includes inorganic luminescent layers 121 and 221 on one side and the opposite side of a substrate 100 having transparency, respectively. Of these inorganic luminescent layers 121 and 221, one inorganic luminescent layer 121 constitutes a bottom-emission type display device 331 on one side of the substrate 100 and the other inorganic luminescent layer 221 constitutes a top-emission type display device 332 on the other side of the substrate 100.

Except for common usage of the substrate 100, other members are the same as those in the display device 11, 21 shown in FIGS. 1 and 2, but, in this composite display device 31, a pixel electrode 218 of the top-emission type display device 332 is made of a transparent conductive film and the substrate 100 is also transparent, while, in the top-emission type display device 21 in FIG. 2, a pixel electrode 218 is not necessary to be transparent.

Luminescent light emitted from the inorganic luminescent layer 121 of the bottom-emission type display device 331 is transmitted through the inside of the bottom-emission type display device 331, the substrate 100, and a pixel electrode 218 of the top-emission type display device 332, reaches the inorganic luminescent layer 221 of the top-emission type display device 332, and is transmitted through the inorganic luminescent layer 221 and an opposite electrode 223 to be emitted to the outside.

That is, the luminescent light emitted from the bottom-emission type display device 331 is transmitted through the inside of the top-emission type display device 332 to be emitted to the outside.

Luminescent light emitted from the inorganic luminescent layer 221 of the top-emission type display device 332 is transmitted through the opposite electrode 223 inside the top-emission type display device 332 to be emitted to the outside.

In this manner, since, in the composite display device 31 in FIG. 3, the luminescent light of the bottom-emission type display device 331 is also emitted from a position where the luminescent light of the top-emission type display device 332 is emitted, the luminescent light, when emitted at the same time, has a summed-up light amount and a high brightness.

A color filter 341 is disposed on the surface of the top-emission type display device 332.

The color filter 341 also includes transmitting parts 342 of R, G, and B and a black matrix 343, similar to that in the above-discussed color filters 141, 241. The transmitting parts 342 are disposed at positions where the luminescent light emitted from the composite display device 31 reaches, and the luminescent light is colored by any one of R, G, and B after having been transmitted through the transmitting part 342.

If the bottom-emission type display device 331 and the top-emission type display device 332 emit light alternately, emission time for each of the inorganic luminescent layers 121 and 221 becomes shorter and the life time thereof becomes longer.

In the composite display device 31, the inorganic luminescent layer 121 of the bottom-emission type display device 331 may be formed first and the inorganic luminescent layer 221 of the top-emission type display device 332 may be formed later, or the reverse order thereof is possible.

Further, the bottom-emission type display device 331 and the top-emission type display device 332 may be formed individually and adhered to each other thereafter.

Each of the above transistors may be formed using crystal silicon in addition to the polycrystal silicon and the amorphous silicon.

The inorganic luminescent layer 121, 221 may be formed either by a sputtering method or an evaporation method, but the sputtering method is suitable for a large-size substrate. Further, the inorganic luminescent layer 121, 221 may be formed by coating and drying or by coating, drying and baking the inorganic luminescent material.

The inorganic luminescent layer 121, 221 is caused to emit light by applying the DC source voltage $V_{dd}$ in each of the above examples, but an AC voltage may be applied for light emission as far as the emission is controlled by a thin-film transistor.

What is claimed is:

1. A composite display device comprising:
   a substrate;
   first pixel electrodes disposed over one surface of the substrate;
   second pixel electrodes disposed over other surface of the substrate;
   a first insulating separation wall, which is disposed between the first pixel electrodes and forms the regions separated on the first pixel electrodes;
   a second insulating separation wall, which is disposed between the second pixel electrodes and forms the regions separated on the second pixel electrodes;
   a first inorganic luminescent layer disposed on the regions separated on the first pixel electrodes;
   a second inorganic luminescent layer disposed on the regions separated on the second pixel electrodes;
   a first opposite electrode disposed on the first inorganic luminescent layer;
   a second opposite electrode disposed on the second inorganic luminescent layer;
   a first thin-film transistor which applies a voltage across the first pixel electrodes and the first opposite electrode in a conduction state and causes the first inorganic luminescent layer to emit light; and
   a second thin-film transistor which applies a voltage across the second pixel electrode and the second opposite electrode in a conduction state and causes the second inorganic luminescent layer to emit light,
   wherein: the substrate, the first and second pixel electrodes, and the second opposite electrode have transparency,
   the second inorganic luminescent layer is located right behind a position of the first inorganic luminescent layer,
   a luminescent light of the first inorganic luminescent layer is transmitted through the first pixel electrode, the substrate, and the second pixel electrode, in this order, to be irradiated on the second inorganic luminescent layer, and transmitted through the second inorganic luminescent layer and the second opposite electrode to be emitted outside, and
   a luminescent light of the second inorganic luminescent layer is transmitted through the second opposite electrode to be emitted outside.

2. The composite display device according to claim 1, wherein a color filter is disposed at a position where the luminescent light transmitted through the second opposite electrode is irradiated.

3. The composite display device according to claim 1, wherein the first and second inorganic luminescent layers contain zinc sulfide.

4. A display device comprising:
   a substrate;
   pixel electrodes disposed on the substrate;
   an insulating separation wall, which is disposed between the pixel electrodes and forms regions separated on the pixel electrodes;
   an inorganic luminescent layer disposed on each of the pixel electrodes;
   an opposite electrode disposed on the inorganic luminescent layer;
   a thin-film transistor which applies a voltage across the pixel electrodes and the opposite electrode and causes the inorganic luminescent layer to emit light in a conduction state thereof; and
   a color filter including transmitting parts corresponding R, G, and B and a black matrix, wherein the color filter is electrically independent from the substrate and is colored by transmitting a luminescent light of the inorganic luminescent layer, and wherein a direct current voltage is applied across the pixel electrodes and the opposite electrode.

5. The composite display device according to claim 1, wherein a direct current voltage is applied across the first pixel electrodes and the first opposite electrode, and a direct current voltage is applied across the second pixel electrodes and the second opposite electrode.

* * * * *